United States Patent
Horisaki

(10) Patent No.: US 10,771,094 B2
(45) Date of Patent: Sep. 8, 2020

(54) MEMORY SYSTEM CONFIGURED TO ESTIMATE A READ VOLTAGE USING A HISTOGRAM

(71) Applicant: Toshiba Memory Corporation, Tokyo (JP)

(72) Inventor: Koji Horisaki, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/286,521

(22) Filed: Feb. 26, 2019

(65) Prior Publication Data

US 2020/0091942 A1     Mar. 19, 2020

(30) Foreign Application Priority Data

Sep. 13, 2018 (JP) ................. 2018-171222

(51) Int. Cl.
| | |
|---|---|
| H03M 13/47 | (2006.01) |
| G11C 16/26 | (2006.01) |
| G06F 11/07 | (2006.01) |
| G11C 11/56 | (2006.01) |
| G11C 16/34 | (2006.01) |

(52) U.S. Cl.
CPC .......... *H03M 13/47* (2013.01); *G06F 11/073* (2013.01); *G11C 11/5642* (2013.01); *G11C 16/26* (2013.01); *G11C 16/34* (2013.01)

(58) Field of Classification Search
CPC ...... H03M 13/47; G06F 11/073; G11C 16/34; G11C 16/26; G11C 11/5642
See application file for complete search history.

(56) References Cited

U.S. PATENT DOCUMENTS

| | | |
|---|---|---|
| 8,149,623 B2 | 4/2012 | Uchikawa et al. |
| 8,934,306 B2 | 1/2015 | Shen et al. |
| 8,964,464 B2 | 2/2015 | Weingarten et al. |

(Continued)

OTHER PUBLICATIONS

H. Zhou, A. Jiang and J. Bruck, "Error-correcting schemes with dynamic thresholds in nonvolatile memories," 2011 IEEE International Symposium on Information Theory Proceedings, St. Petersburg, 2011, pp. 2143-2147. (Year: 2011).*

(Continued)

*Primary Examiner* — Cynthia Britt
(74) *Attorney, Agent, or Firm* — Kim & Stewart LLP

(57) ABSTRACT

A memory system includes a nonvolatile memory and a memory controller. The memory controller determines a read voltage for first data encoded by a first encoding scheme, by generating a first histogram indicating the number of memory cells for each threshold voltage, and estimating the read voltage using: (a) the first histogram that is corrected based on a first parameter of the first encoding scheme, and a second parameter of a second encoding scheme, and an estimation function for estimating a read voltage for second data encoded by the second encoding scheme, or (b) the uncorrected first histogram, and the estimation function that is corrected based on the first and second parameters, or (c) the first histogram after partial correction based on the first and second parameters, and the estimation function after partial correction based on the first and second parameters.

16 Claims, 5 Drawing Sheets

(56) References Cited

U.S. PATENT DOCUMENTS 9,069,659 B1 6/2015 Sabbag et al.
2015/0331748 A1* 11/2015 Cohen ................ G06F 11/1012
714/764

OTHER PUBLICATIONS

F. Sala, R. Gabrys and L. Dolecek, "Dynamic Threshold Schemes for Multi-Level Non-Volatile Memories," in IEEE Transactions on Communications, vol. 61, No. 7, pp. 2624-2634, Jul. 2013. (Year: 2013).*

* cited by examiner

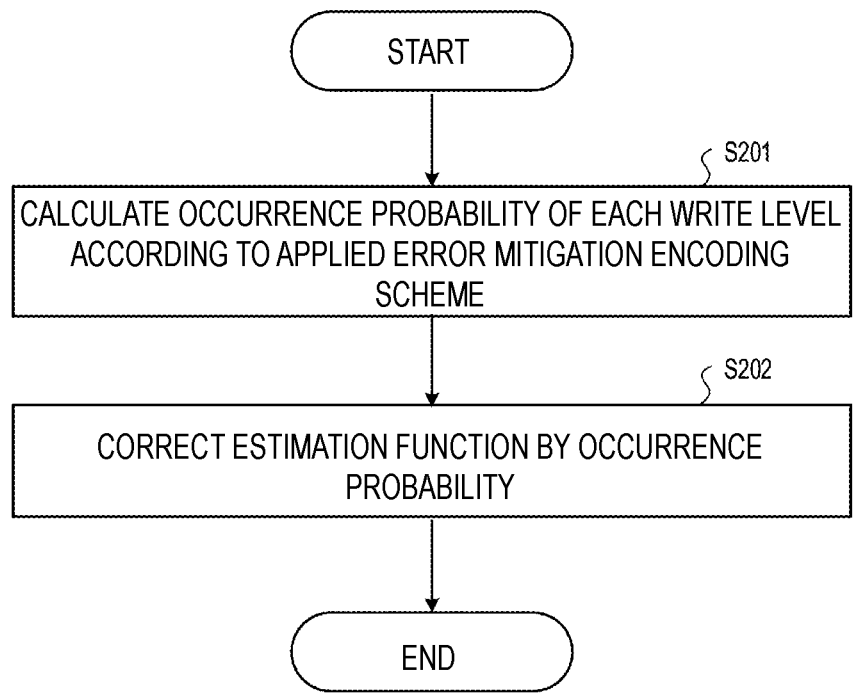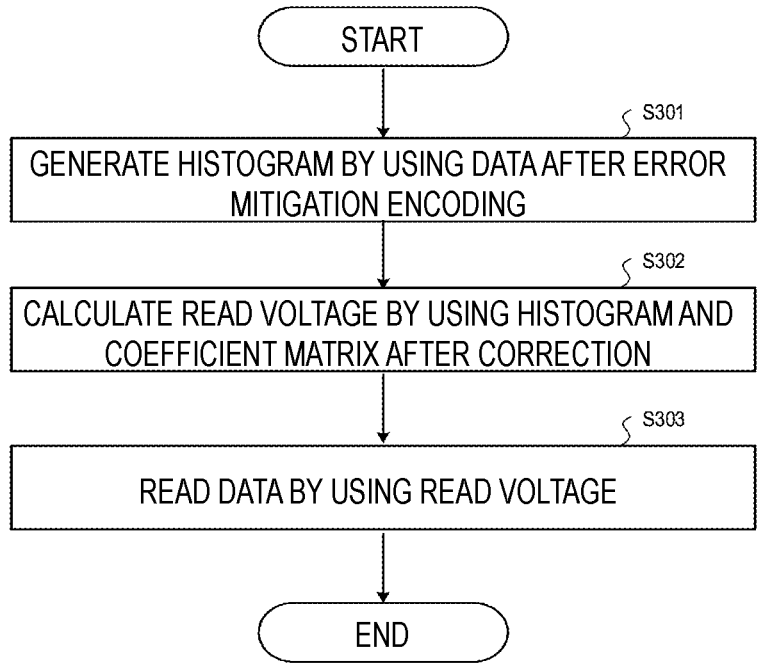

MEMORY SYSTEM CONFIGURED TO ESTIMATE A READ VOLTAGE USING A HISTOGRAM

CROSS-REFERENCE TO RELATED APPLICATIONS

This application is based upon and claims the benefit of priority from Japanese Patent Application No. 2018-171222, filed Sep. 13, 2018, the entire contents of which are incorporated herein by reference.

FIELD

Embodiments described herein relate generally to a memory system.

BACKGROUND

In a memory system using a NAND type flash memory (hereinafter, referred to as a NAND memory) as a storage medium, a threshold voltage of a memory cell changes due to, for example, data retention and read disturbance. This causes a bit error rate in the data read from the NAND memory to increase, and as a result, the reliability of the memory system may deteriorate. As a countermeasure against such a deterioration in reliability, a technique for estimating a voltage (read voltage) used at the time of reading in consideration of, for example, a change in threshold voltage or the like has been proposed.

For example, a technique of estimating the read voltage to be used for actual reading by utilizing a distribution of threshold voltages measured using a reference read voltage has been proposed. In such a technique, since the read voltage is estimated by performing a measurement using, for example, approximately seven reference read voltages, the processing time can be long. Further, in such a technique, information used for estimating the read voltage requires measuring the threshold voltage using an actual NAND memory.

DESCRIPTION OF THE DRAWINGS

FIG. 7 is a flowchart illustrating an example of a correction process according to the embodiment.

FIG. 8 is a flowchart illustrating an example of a read process according to the embodiment.

DETAILED DESCRIPTION

Embodiments provide a memory system capable of estimating a read voltage with improved accuracy.

In general, according to one embodiment, a memory system includes a nonvolatile memory and a memory controller. The nonvolatile memory includes a plurality of memory cells. The memory controller is configured to determine a read voltage to be applied to the nonvolatile memory to read first data encoded by a first encoding scheme of a plurality of error mitigation encoding schemes from the nonvolatile memory, by generating a first histogram indicating the number of memory cells for each of a plurality of threshold voltage ranges, and then estimating the read voltage used for reading the first data by using: (a) the first histogram after correction which is obtained by correcting the first histogram based on a parameter of the first encoding scheme and a parameter of a second encoding scheme of the plurality of error mitigation encoding schemes, and an estimation function for estimating a read voltage used for reading second data encoded by the second encoding scheme, (b) the first histogram before correction, and the estimation function after correction which is obtained by correcting the estimation function based on the parameter of the first encoding scheme and the parameter of the second encoding scheme, or (c) the first histogram after correction which is obtained by correcting a part of the first histogram based on the parameter of the first encoding scheme and the parameter of the second encoding scheme, and the estimation function after correction which is obtained by correcting a part of the estimation function based on the parameter of the first encoding scheme and the parameter of the second encoding scheme.

Hereinafter, a memory system according to an embodiment will be described in detail with reference to the accompanying drawings. In addition, the present disclosure is not limited by the following embodiment.

Figure 1:
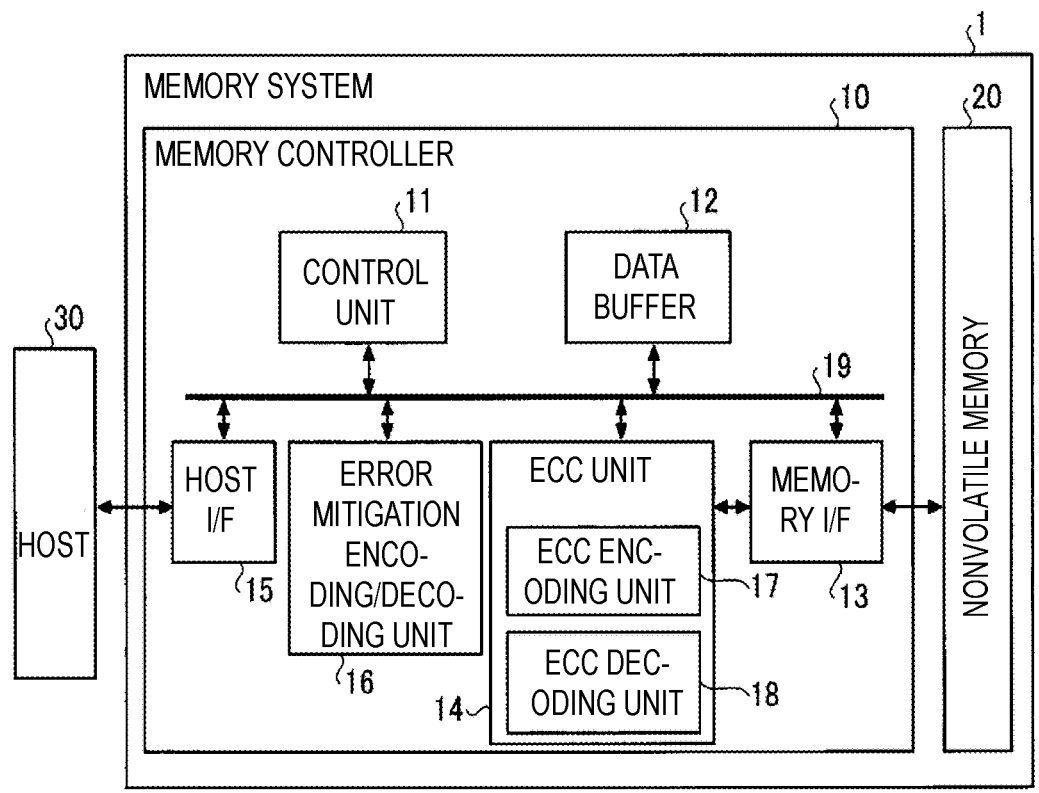
FIG. 1 is a block diagram illustrating an example of a schematic configuration of a memory system according to an embodiment.

First, a memory system according to an embodiment will be described in detail with reference to the drawings. FIG. 1 is a block diagram illustrating an example of a schematic configuration of a memory system according to an embodiment. As illustrated in FIG. 1, a memory system 1 includes a memory controller 10 and a nonvolatile memory 20. The memory system 1 is connectable with a host 30, and FIG. 1 illustrates a state in which the memory system 1 is connected with the host 30. The host 30 may be, for example, an electronic device such as a personal computer or a portable terminal.

The nonvolatile memory 20 is a nonvolatile memory that stores data in a nonvolatile manner, and is, for example, a NAND type flash memory (hereinafter, simply referred to as a NAND memory). In the following description, a case in which a 2D structure NAND memory is used as the nonvolatile memory 20 will be described, but a memory device other than the 2D structure NAND memory such as a 3D structure flash memory, a resistive random access memory (ReRAM), or a ferroelectric random access memory (FeRAM) may be used. Further, the nonvolatile memory 20 may not necessarily be a semiconductor memory, but the embodiment may be applied to various memory media in addition to the semiconductor memory.

The memory system 1 may be any one of various memory systems including the nonvolatile memory 20, such as a so-called solid state drive (SSD) or a memory card in which the memory controller 10 and the nonvolatile memory 20 are integrated in one package.

The memory controller 10 controls writing to the nonvolatile memory 20 according to a write request from the host 30. Further, the memory controller 10 controls reading from the nonvolatile memory 20 according to a read request from the host 30. The memory controller 10 is a semiconductor integrated circuit configured as, for example, a system on a chip (SoC). The memory controller 10 includes a host interface (I/F) 15, a memory interface (I/F) 13, a control unit 11, an error correcting code (ECC) unit (codec) 14, an error mitigation encoding/decoding unit 16, and a data buffer 12. The host I/F 15, the memory I/F 13, the control unit 11, and the ECC unit 14, and the data buffer 12 are connected to each other via an internal bus 19. Some or all of operations of the respective components of the memory controller 10 to be described below may be implemented by executing firmware in a central processing unit (CPU) or implemented by hardware.

The host I/F 15 performs a processing according to an interface standard with the host 30, and outputs, for example, a command received from the host 30 and user data to be written to the internal bus 19. Further, the host I/F 15 transmits, for example, user data read and restored from the nonvolatile memory 20 and a response from the control unit 11 to the host 30.

The memory I/F 13 performs a write process on the nonvolatile memory 20 based on an instruction from the control unit 11. Further, the memory I/F 13 performs a read process on the nonvolatile memory 20 based on an instruction from the control unit 11.

The data buffer 12 temporarily stores the user data received from the host 30 by the memory controller 10 until the received data is stored in the nonvolatile memory 20. Further, the data buffer 12 temporarily stores the user data read from the nonvolatile memory 20 until the data is transmitted to the host 30. As the data buffer 12, for example, a universal memory such as a static random access memory (SRAM) or a dynamic random access memory (DRAM) may be used. Further, the data buffer 12 may be mounted outside the memory controller 10, instead of being embedded in the memory controller 10.

The control unit 11 controls the respective components of the memory system 1. When the control unit 11 receives a command from the host 30 via the host I/F 15, the control unit 11 performs a control according to the command. For example, the control unit 11 instructs the memory I/F 13 to write the user data and parity to the nonvolatile memory 20 according to the command from the host 30. Further, the control unit 11 instructs the memory I/F 13 to read the user data and parity from the nonvolatile memory 20 according to the command from the host 30.

In addition, when a write request of user data is received from the host 30, the control unit 11 determines a storage area in the nonvolatile memory 20 with respect to the user data to be accumulated in the data buffer 12. That is, the control unit 11 manages a write destination of the user data. A correspondence between a logical address of the user data received from the host 30 and a physical address indicating the storage area in the nonvolatile memory 20 in which the user data is stored, is stored as an address conversion table.

Further, when a read request is received from the host 30, the control unit 11 converts the logical address specified by the read request into the physical address by using the above-described address conversion table, and instructs the memory I/F 13 to perform a reading from the physical address.

In the NAND memory, in general, writing and reading are performed based on a data unit called a page, and erasing is performed based on a data unit called a block. In the embodiment, a plurality of memory cells connected to the same word line is referred to as a memory cell group. When the memory cell is a single level cell (SLC), one memory cell group corresponds to 1 page. When the memory cell is a multiple level cell (MLC), one memory cell group corresponds to 2 pages. Further, in the present description, a triple level cell (TLC) stores 3 bits in one memory cell and a quad level cell (QLC) stores 4 bits in one memory cell. In addition, each memory cell is connected to a bit line, in addition to the word line. Accordingly, each memory cell may be identified with an address for identifying the word line and an address for identifying the bit line.

The user data transmitted from the host 30 is transmitted to the internal bus 19 and temporarily stored in the data buffer 12.

The error mitigation encoding/decoding unit 16 performs error mitigation encoding of the user data stored in the nonvolatile memory 20 by, for example, an error mitigation coding scheme designated by the control unit 11. In addition, the error mitigation encoding/decoding unit 16 performs error mitigation decoding of the user data read from the nonvolatile memory 20 and restored by the ECC unit 14. A unit to which the error mitigation encoding is applied may be all memory cells or memory cells connected to one word line.

The error mitigation encoding is a process for converting data to be written and biasing the threshold voltage of the memory cell. This may reduce the number of cells programmed to a threshold voltage having poor characteristics with respect to cell exhaustion and bit error rate (BER) and increase the number of cells programmed to a threshold voltage having good characteristics. The term "cell exhaustion" means an intercell interference effect and exhaustion of the memory cell by writing and erasing.

For example, cell exhaustion and BER characteristics tend to be worse as the threshold voltage becomes relatively high. In such a case, the error mitigation encoding/decoding unit 16 performs the error mitigation encoding so as to make an appearance probability, expressed as P (Vth), of the memory cell with a high threshold voltage be low and an appearance probability P(Vth) of the memory cell with a low threshold voltage be high.

An error mitigation code may be called an error mitigation code, and as the error mitigation code, for example, asymmetric coding is known.

The ECC unit 14 encodes the user data stored in the nonvolatile memory 20 to generate a codeword. When the error mitigation encoding is executed, the ECC unit 14 encodes the user data after the error mitigation encoding to generate the codeword. Further, the ECC unit 14 decodes a received word read from the nonvolatile memory 20 to restore the user data. Therefore, the ECC unit 14 includes an ECC encoder 17 and an ECC decoder 18. The encoding and decoding by the ECC unit 14 are encoding and decoding of an error correction code of the user data. Further, data encoded by the ECC unit 14 may include, for example, control data used in the memory controller 10, in addition to the user data.

Subsequently, the write process of the embodiment will be described. The control unit 11 instructs the ECC encoding unit 17 to encode the user data at the time of writing the user data to the nonvolatile memory 20. At that time, the control unit 11 determines a storage location (e.g., storage address) of the codeword in the nonvolatile memory 20, and instructs the determined storage location to the memory I/F 13.

When the error mitigation encoding is executed, the control unit 11 instructs the error mitigation encoding/decoding unit 16 to perform error mitigation encoding of the user data. The error mitigation encoding/decoding unit 16 performs the error mitigation encoding of the user data in the data buffer 12 based on the instruction from the control unit 11.

The ECC encoding unit 17 encodes the user data in the data buffer 12 based on the instruction from the control unit 11 to generate the codeword. When the error mitigation encoding is performed, the ECC encoding unit 17 reads the user data that has been subjected to the error mitigation encoding from the data buffer 12, and encodes the read user data to generate the codeword. As the encoding scheme of the error correction code, as described later, an encoding scheme using algebraic codes such as Bose-Chaudhuri-Hocquenghem (BCH) code or Reed-Solomon (RS) code or an encoding scheme using a code based on a sparse graph such as Low-Density Parity-Check (LDPC) code may be adopted. The memory I/F 13 performs a control to store the codeword in the storage location in the nonvolatile memory 20 instructed from the control unit 11.

Next, the process at the time of reading from the nonvolatile memory 20 according to the embodiment will be described. At the time of reading from the nonvolatile memory 20, the control unit 11 designates an address in the nonvolatile memory 20 and instructs reading to the memory I/F 13. Further, the control unit 11 instructs the ECC decoding unit 18 to start decoding. In accordance with the instruction from the control unit 11, the memory I/F 13 reads the received word from the designated address in the nonvolatile memory 20, and inputs the read received word to the ECC decoding unit 18. The ECC decoding unit 18 decodes the received word read from the nonvolatile memory 20. When error mitigation decoding is executed, the control unit 11 instructs the error mitigation encoding/decoding unit 16 to perform the error mitigation decoding of the received word decoded by the ECC decoding unit 18.

For example, first, the control unit 11 may cause the ECC decoding unit 18 to perform hard decision decoding, and when the received word may not be decoded by the hard decision decoding, the control unit 11 may configure the ECC decoding unit 18 to execute soft decision decoding.

Further, when the nonvolatile memory 20 is the NAND memory, at the time of writing data, electrons are injected so that the number of electrons in a floating gate corresponds to one of a plurality of distributions (threshold voltage distributions) according to a write value x. Here, for simplifying the description, an example of the single level cell (SLC) in which one memory cell stores 1 bit will be described. For the SLC, any one of two distributions corresponds to 0, and the other distribution corresponds to 1. When a voltage is applied to the memory cell, current flows when a voltage equal to or higher than a voltage value corresponding to the charge amount of the memory cell is applied, and no current flows when a voltage less than the corresponding voltage value is applied. Therefore, a voltage serving as a boundary is determined for each memory cell according to the charge amount of the memory cell. Here, the voltage value determined according to the charge amount of the memory cell is called the threshold voltage. In an initial state, charges are injected so as to correspond to any one of two threshold voltage distributions. At the time of reading, a read voltage (also referred to as a read level) for delimiting two threshold voltage distributions is applied to the memory cell, and as a result, it may be determined whether the data stored in the memory cell is 1 or 0.

Figure 2:
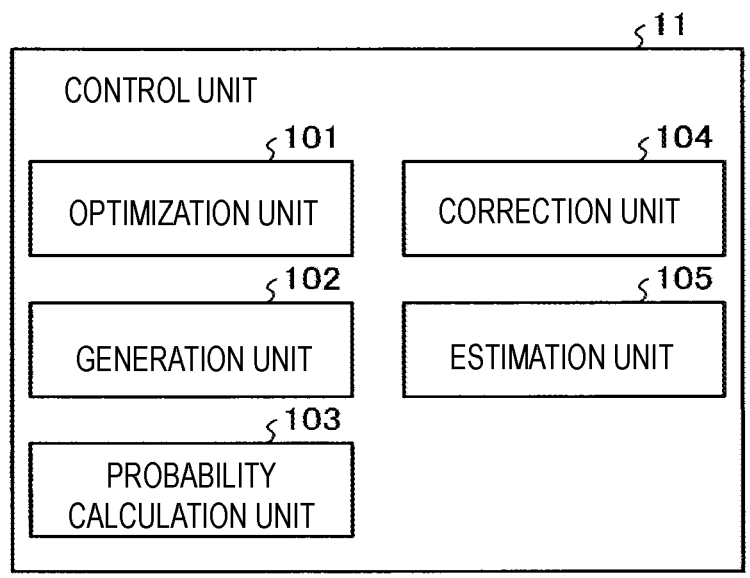
FIG. 2 is a block diagram illustrating an example of a functional configuration of a control unit according to an embodiment.

Next, an example of a functional configuration of the control unit 11 will be described. FIG. 2 is a block diagram illustrating an example of a functional configuration of a control unit 11. As illustrated in FIG. 2, the control unit 11 includes an optimization unit 101, a generation unit 102, a probability calculation unit 103, a correction unit 104, and an estimation unit 105.

FIG. 2 illustrates an example of each unit that executes a function used for estimating the read voltage. The control unit 11 may have a function of a unit other than each unit as described above. Further, some or all of the respective units illustrated in FIG. 2 may be provided in units other than the control unit 11. For example, some or all of the units illustrated in FIG. 2 may be provided by running a program stored in the data buffer 12 in a processor, or provided in another hardware circuit connected to the internal bus 19.

The optimization unit 101 obtains the reference read voltage and the estimation function by performing an optimization process. The reference read voltage is a read voltage used for generating a distribution (in particular, histogram) of the threshold voltage. The estimation function is a function for estimating the read voltage used for actual reading using the histogram. The optimization unit 101 may obtain the reference read voltage and the estimation function by any method.

The estimation function may be any function such as a linear function, a polynomial function, and a least mean square error estimation function. The estimation function may be, for example, a form of a matrix (coefficient matrix) for calculating an estimated value of the read voltage by a product with a vector having a frequency corresponding to each write level of the histogram as an element. For example, when the memory cell is the TLC and the number of write levels is 8 (Er, A, B, C, D, E, F, and G), a coefficient matrix of 8 rows×7 columns for estimating 7 read voltages may be used as the estimation function from a vector having eight frequencies corresponding to eight write levels as elements.

For example, the optimization unit 101 obtains a reference read voltage to minimize a predetermined error function using the reference read voltage and the number of memory cells in which a read value at the time of applying the reference read voltage is, for example, 1. Further, the optimization unit 101 obtains an estimation function to minimize the predetermined error function using the read voltage and the number of memory cells in which the read value is, for example, 1.

When an encoding scheme Enc1 of any error mitigation code is determined, the reference read voltage and the estimation function may be calculated before for example, a vendor (a vendor of the memory system 1, a vendor of the memory controller 10, or a vendor of the nonvolatile memory 20) ships a product, with respect to the nonvolatile memory 20 to which the encoding scheme End is applied. That is, information representing the reference read voltage and the estimation function calculated before the shipment may be stored in, for example, the nonvolatile memory 20 and used. In such a case, the optimization unit 101 may be omitted. Further, the encoding scheme End may include a scheme of writing data to the nonvolatile memory 20 without performing the error mitigation encoding or a scheme of writing data to the nonvolatile memory 20 by performing the error mitigation encoding.

The generation unit 102 generates the distribution (in particular, histogram) of the threshold voltages measured by using the reference read voltage. For example, the generation unit 102 reads data D1 to which the encoding scheme End is applied from the nonvolatile memory 20, and generates a histogram Hist1 indicating the number of memory cells for each threshold voltage.

The histogram Hist1 is used for the optimization process of the estimation function by the optimization unit 101. The generation unit 102 generates a histogram Hist2 with respect to data D2 to which an encoding scheme Enc2 of the error mitigation encoding, other than the encoding scheme Enc1, is applied. The histogram Hist2 is used for an estimation process of the read voltage by the estimation unit 105.

In the embodiment, the calculation of the estimation function by the optimization unit 101 may be performed only on the data to which the encoding scheme End is applied. With respect to the data to which another encoding scheme Enc2 is applied, at least one of the histogram generated from the data to which the encoding scheme Enc2 is applied and the estimation function calculated with respect to the encoding scheme End is corrected by the correction unit 104 and used for estimating the read voltage by the estimation unit 105.

The probability calculation unit 103 calculates occurrence probabilities of a plurality of write levels based on an encoding parameter of the encoding scheme. The encoding parameter is a parameter for determining an operation of the error mitigation encoding, such as which write level to which the threshold voltage corresponds is biased. In the error mitigation code, when the encoding parameter is determined, in other words, when it is determined how to bias the threshold voltage, an expectation value (occurrence probability expectation value) of the occurrence probability of each write level may be calculated. In an encoding scheme that does not perform the error mitigation encoding, the probability calculation unit 103 may interpret that the encoding parameter that does not bias the threshold voltage is designated, and calculate the occurrence probability.

The probability calculation unit 103 calculates occurrence probabilities of the plurality of write levels based on the encoding parameter of the encoding scheme Enc1, and occurrence probabilities of the plurality of write levels based on the encoding parameter of the encoding scheme Enc2.

When the encoding parameter of each encoding scheme is determined before the shipment of the product, the occurrence probability of each encoding scheme may also be calculated before the shipment of the product. In such a case, since the occurrence probability calculated before the shipment of the product may be stored in the memory medium such as the nonvolatile memory and used, the probability calculation unit 103 may be omitted.

Figure 3:
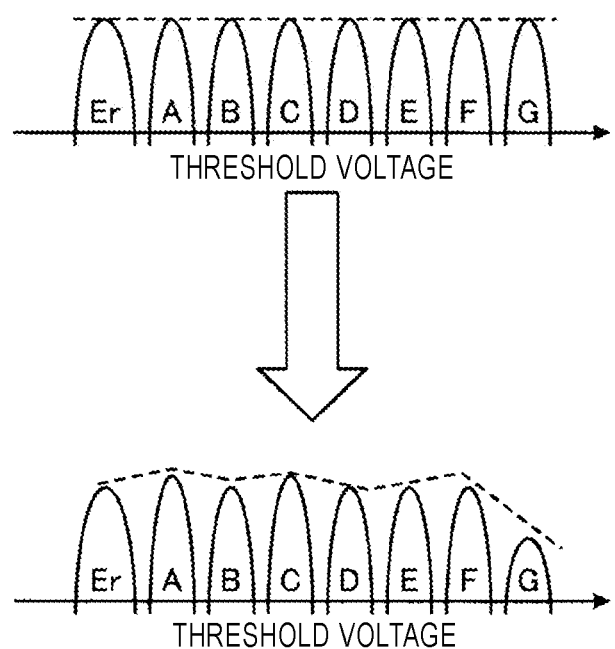
FIG. 3 is a diagram illustrating an example of a processing of an error mitigation code when a memory cell is a TLC.
Figure 4:
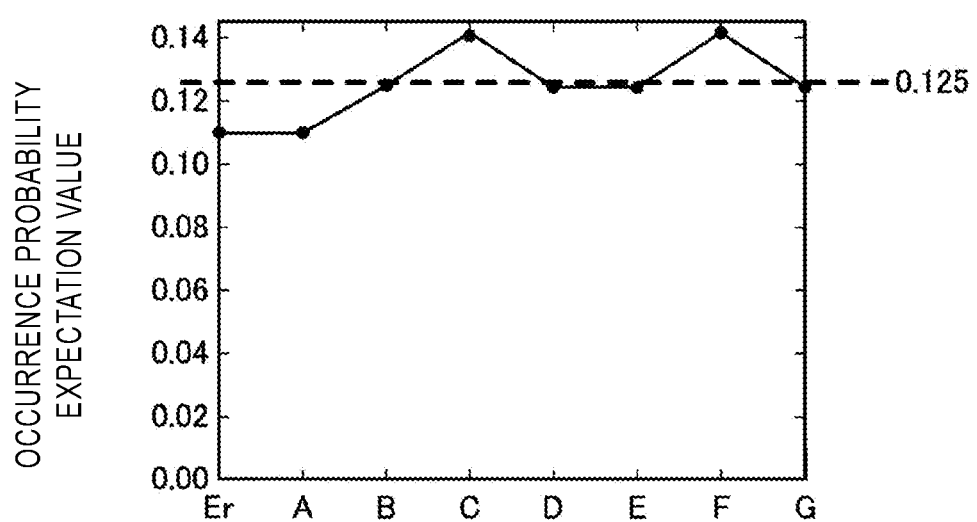
FIG. 4 is a diagram illustrating an example of an occurrence probability expectation value.

FIG. 3 is a diagram illustrating an example of the write level before and after the error mitigation encoding when the memory cell is the TLC. When the memory cell is the TLC, for example, the write level takes eight levels Er, A, B, C, D, E, F, and G. In the encoding scheme that does not perform the error mitigation encoding, since occurrence probability expectation values of the respective write levels are equal to each other, each occurrence probability expectation value may be calculated as 0.125 (=⅛). In the encoding scheme that performs the error mitigation encoding, for example, the probability calculation unit 103 calculates occurrence probability expectation values which may be different from each other like 0.11, 0.11, 0.125, 0.14, 0.125, 0.125, 0.14, and 0.125, with respect to the write levels Er, A, B, C, D, E, F, and G, respectively. FIG. 4 is a diagram illustrating an example of the occurrence probability expectation value calculated as above. Further, the method of the embodiment may be applied to MLC and QLC, in addition to the TLC.

Referring back to FIG. 2, the correction unit 104 corrects at least one of the histogram Hist2 generated with respect to the data D2 to which the encoding scheme Enc2 is applied and the estimation function calculated by the optimization unit 101, based on the parameter of the encoding scheme Enc2 and the parameter of the encoding scheme Enc1. For example, the correction unit 104 obtains a ratio of the occurrence probability expectation value of the encoding scheme Enc2 to the expectation value of the occurrence probability of the encoding scheme End at each write level. The correction unit 104 corrects each value (representing frequency) corresponding to each write level of the histogram by dividing each value corresponding to the write level of the histogram by the obtained ratio for the corresponding write level.

For example, assuming that a scheme that does not perform the error mitigation encoding is used as the encoding scheme, the occurrence probability expectation value is 0.125 for each write level as described above. Further, it is assumed that the occurrence probability expectation values of the encoding scheme Enc2 are 0.11, 0.11, 0.125, 0.14, 0.125, 0.125, 0.14, and 0.125 with respect to the write levels Er, A, B, C, D, E, F, and G, respectively, as in the example described above. In this case, the correction unit 104 divides the frequency of the histogram corresponding to, for example, the write level Er by 0.11/0.125.

Even when the estimation function is calculated for the encoding scheme of performing the error mitigation encoding, by using the expectation value of occurrence probability of the encoding scheme and the expectation value of the occurrence probability of the encoding scheme of data to be actually read, the histogram and the estimation function may be corrected.

As described above, when the coefficient matrix is used as the estimation function, an estimation value of the read voltage is calculated from a product of the coefficient matrix and the vector with a frequency corresponding to each write level of the histogram as the element. Therefore, instead of correcting the frequency, the same estimation value may be calculated even when the element of the matrix for which the product with the frequency is calculated is corrected. That is, the correction unit 104 may correct the coefficient matrix by the occurrence probability. When the coefficient matrix and the occurrence probability may be obtained before the shipment of the product, the corrected coefficient matrix may also be obtained before the shipment of the product.

When the corrected estimation function is obtained before the shipment of the product, information indicating the obtained estimation function may be stored in the memory medium such as the nonvolatile memory 20 and used, and as a result, the correction unit 104 may be omitted.

Some of the respective frequencies of the histogram may be corrected, and an element of a corresponding matrix may be corrected with respect to a frequency which is not corrected. That is, the correction unit 104 may correct at least one of the histogram and the estimation function.

The estimation unit 105 estimates the read voltage used for reading data from the nonvolatile memory 20 from the histogram and the estimation function. For example, when the histogram Hist2 is corrected by the correction unit 104, the estimation unit 105 estimates the read voltage used for reading the data D2 using the corrected histogram Hist2 and the uncorrected estimation function. When the estimation function is corrected by the correction unit 104, the estimation unit 105 estimates the read voltage used for reading the data D2 using the uncorrected histogram Hist2 and the estimation function after correction.

Since the data D1 to which the encoding scheme End is applied is data used for calculating the estimation function, the estimation function need not be corrected when the data D1 is read. Therefore, when the data D1 is read, the estimation unit 105 estimates the read voltage used for reading the data D1 by using the histogram Hist1 and the uncorrected estimation function.

Figure 5:
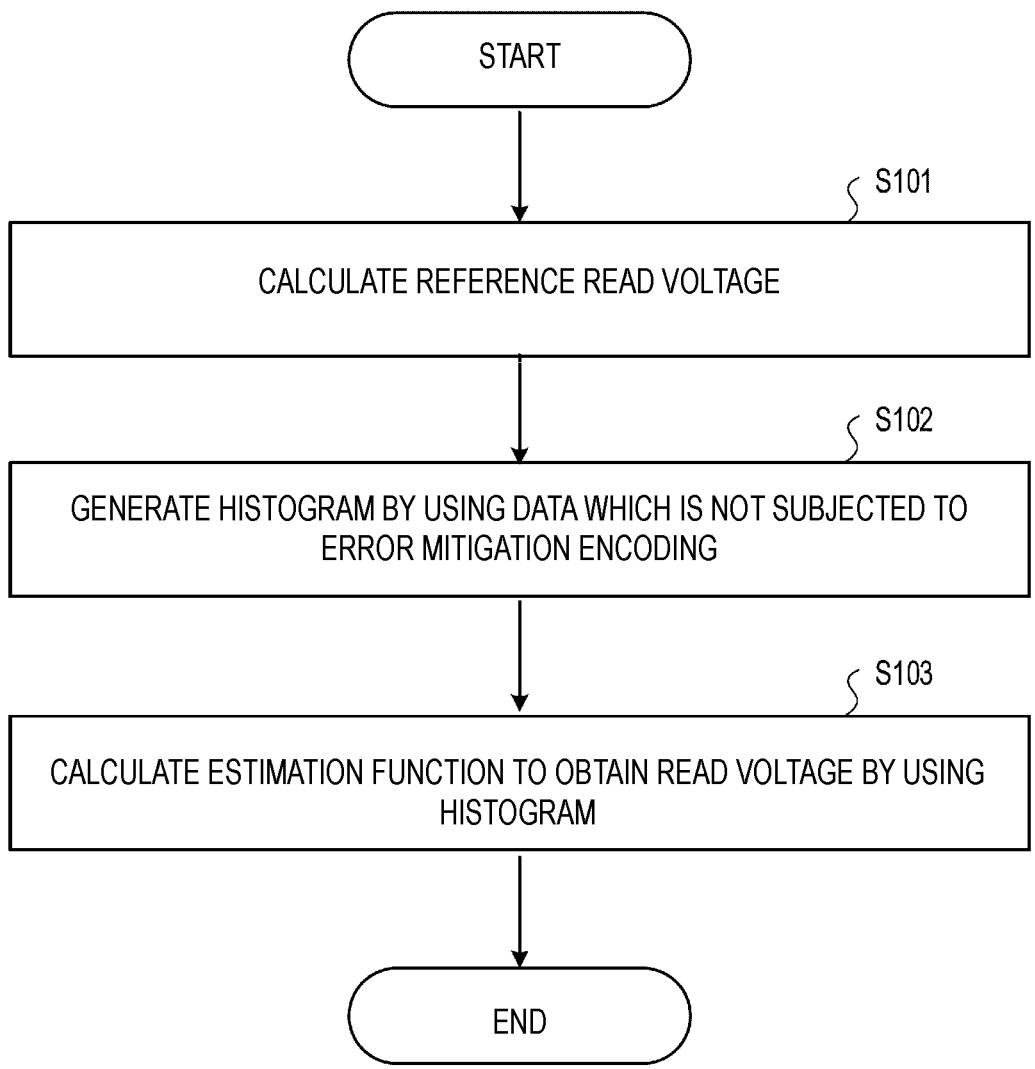
FIG. 5 is a flowchart illustrating an example of a process of calculating an estimation function according to the embodiment.

Next, a flow of the calculation process of the estimation function by the memory system according to the embodiment will be described. FIG. 5 is a flowchart illustrating an example of the calculation process of the estimation function in the embodiment.

First, the optimization unit 101 calculates an optimization value of the reference read voltage by performing the optimization process (step S101).

The generation unit 102 performs reading using the reference read voltage with respect to the nonvolatile memory 20 in which data is written without performing the error mitigation encoding, and generates the histogram Hist1 (step S102). For example, the generation unit 102 measures the threshold voltage of each memory cell of the nonvolatile memory 20 by using the plurality of reference read voltages obtained in step S101, and generates a histogram indicating the distribution of the measured threshold voltage.

Next, the optimization unit 101 calculates the estimation function for estimating the read voltage using the generated histogram (step S103).

As described above, when the encoding scheme of the error mitigation code to be applied is determined, information indicating the reference read voltage and the estimation function may be calculated before the product is shipped according to the same procedure as the present flowchart. The information representing the reference read voltage and the estimation function calculated before the shipment of the product may be stored in, for example, the nonvolatile memory 20 and referred-to at the time of the processing after the shipment of the product. In this case, the memory system need not include the optimization unit 101, and further, the process of the flowchart need not be executed.

Figure 6:
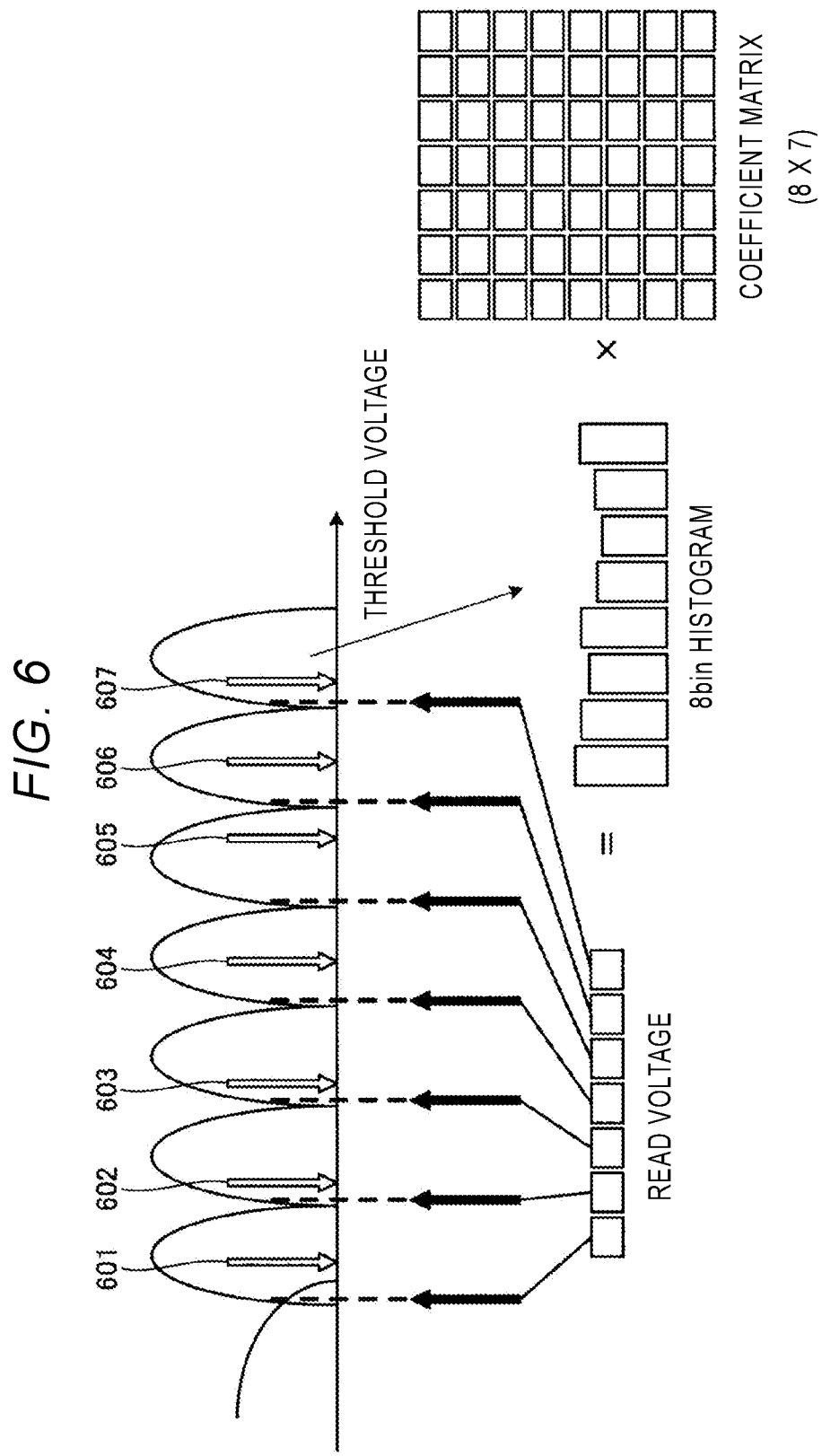
FIG. 6 is a diagram schematically illustrating a process of calculating an estimation function.

FIG. 6 is a diagram schematically illustrating a process of estimating the read voltage by using the calculated estimation function. FIG. 6 illustrates an example in which the generation unit 102 generates a histogram having eight bins using seven reference read voltages 601 to 607. Further, FIG. 6 illustrates an example of using the coefficient matrix as the estimation function. Seven read voltages are estimated by a product of a vector with frequencies corresponding to eight bins of the histogram as the elements and a coefficient matrix of 8 rows×7 columns. Further, the number of reference read voltages need not be seven. For example, the histogram can be generated with higher accuracy by using eight or more reference read voltages. Further, by using less than seven reference read voltages, a processing speed can be further increased.

When the written data is used for calculating the estimation function without performing the error mitigation encoding, the encoding parameter of the error mitigation code need not be optimized. Accordingly, the calculation process of the estimation function may be started without a preprocess such as the optimization process of the encoding parameter. Therefore, for example, it is possible to shorten a time period until the product using the memory system is provided.

Even when the written data is used for calculating the estimation function by performing the error mitigation encoding, the calculation process of the estimation function may be performed one time for any one error encoding scheme. That is, when a plurality of encoding schemes is applied, the calculation process of the estimation function need not be executed for each of the plurality of encoding schemes. Accordingly, for example, it is possible to shorten a schedule from obtaining the sample of the memory system until the shipment of the product.

Next, a flow of the correction process by the memory system according to the embodiment will be described. FIG. 7 is a flowchart illustrating an example of a correction process according to an embodiment. Further, FIG. 7 illustrates an example of correcting the estimation function.

The probability calculation unit 103 calculates the occurrence probability of each write level according to the encoding scheme (e.g., encoding scheme Enc2) of the error mitigation code to be applied (step S201). The correction unit 104 corrects the estimation function by the calculated occurrence probability (step S202). The estimation function to be corrected is an estimation function calculated before the shipment of the product by using the data to which the encoding scheme Enc1 is applied according to, for example, the procedure illustrated in FIG. 5. When the coefficient matrix is used as the estimation function, the correction unit 104 obtains a ratio of the occurrence probability expectation value of the encoding scheme Enc2 to the expectation value of the occurrence probability of the encoding scheme Enc1 at each write level. The correction unit 104 corrects a value of each column of the coefficient matrix calculated before the shipment of the product, by dividing the value of each column by the ratio obtained with respect to the corresponding write level.

In the case of correcting the estimation function, when the encoding scheme of the error mitigation code to be applied is determined, the occurrence probability is calculated to correct the estimation function. That is, the histogram need not be generated by reading data from the nonvolatile memory 20. As a result, it is possible to obtain the corrected estimation function before the shipment of the product. Information representing the corrected estimation function is stored in, for example, the nonvolatile memory 20, and may be referred-to at the time of an actual read process.

When the histogram is corrected, the correction unit 104 may perform the correction by the occurrence probability for the histogram generated by the generation unit 102 as a correction target.

Next, a flow of the read process by the memory system according to the embodiment will be described. FIG. 8 is a flowchart illustrating an example of the read process in the embodiment. The read process of FIG. 8 is, for example, a process when the data to which the encoding scheme Enc2 is applied is read from the nonvolatile memory 20.

The generation unit 102 performs reading using the reference read voltage with respect to the nonvolatile memory 20 in which data is written by applying the error mitigation code by the encoding scheme Enc2 and generates the histogram Hist2 (step S301). The generation unit 102 generates a histogram indicating the distribution of the threshold voltages of the respective memory cells of the nonvolatile memory 20 using a plurality of reference read voltages (e.g., seven reference read voltages). The reference read voltage used in this case is the same as the reference read voltage used in estimating the estimation function, that is, the reference read voltage used for the encoding scheme Enc1.

The estimation unit 105 estimates the read voltage by the product of the histogram Hist2 and the estimation function corrected by, for example, the flow of FIG. 7 (step S302). When the estimation function corrected before the shipment of the product is used, the estimation unit 105 may read information of the estimation function corresponding to the applied encoding scheme (encoding scheme Enc2 in the present example) from, for example, the nonvolatile memory 20 and use the read information. When the plurality of encoding schemes may be applied, the estimation unit 105 may specify the applied encoding scheme from, for example, setting information and use an estimation function corresponding to the specified encoding scheme. The setting information is information to specify the applied encoding scheme and is stored in, for example, the nonvolatile memory 20.

Thereafter, the control unit 11 reads the data from the nonvolatile memory 20 by using the calculated read voltage (step S303). In the case of performing the hard decision decoding, for example, the control unit 11 specifies to which write level the threshold voltage written in the memory cell corresponds, using each of the calculated read voltages. In the case of performing the soft decision decoding, for example, the control unit 11 performs reading using the read voltage shifted by a predetermined value to a low voltage side and a high voltage side with reference to the calculated read voltage as a reference.

In the read process, the reference read voltage obtained for a predetermined encoding scheme may be used for other encoding schemes. That is, in the embodiment, the reference read voltage need not be optimized for each encoding scheme of the error mitigation code. Therefore, for example, a storage area for storing information indicating the reference read voltage may be reduced. Further, since the estimation unit 105 does not need to read information indicating the reference read voltage corresponding to the applied encoding scheme from, for example, the nonvolatile memory 20, the estimation unit 105 may reduce the processing time as the entire read process.

Since the error mitigation encoding changes the occurrence probability (or occurrence frequency) of the write level of the write data, the error mitigation encoding influences the distribution of the threshold voltage. That is, the error mitigation code may affect the process of estimating the read voltage using the distribution of the threshold voltage. Therefore, when both of them are used in combination, it is necessary to deal with the influence.

As one countermeasure, a sequential method may be considered, in which an encoding parameter of the error mitigation code is first optimized, and thereafter, the estimation function is optimized by using encoding data encoded by the error mitigation code. However, in this method, it is necessary to optimize the encoding parameter and optimize estimation functions with respect to, for example, each of a plurality of error mitigation code schemes. Further, the schedule from obtaining the sample of the device until the shipment of the product becomes relatively long.

Therefore, the memory system of the embodiment obtains the reference read voltage and the estimation function for estimating actual read voltage by using data to which any one encoding scheme is applied. For data to which another encoding method is applied, the distribution (in particular, histogram) or estimation function of the threshold voltage generated from the data is corrected based on the encoding parameter of the encoding scheme and used for estimating the read voltage. As a result, the optimization of the encoding parameter and the optimization of the estimation function are sufficient when the optimizations are carried out for any one encoding scheme.

In addition, when a method that does not perform an encoding (e.g., a method that does not apply the error mitigation code) is used as the encoding scheme of obtaining the estimation function, it is possible to start the process of optimizing the estimation function without waiting the optimization of the encoding parameter. That is, the time period until the shipment of the product can be further shortened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory that includes a plurality of memory cells; and
a memory controller configured to determine a read voltage to be applied to the nonvolatile memory to read first data encoded by a first encoding scheme of a plurality of error mitigation encoding schemes from the nonvolatile memory, by generating a first histogram indicating the number of memory cells for each of a plurality of threshold voltage ranges, and then estimating the read voltage used for reading the first data by using:
(a) the first histogram after correction which is obtained by correcting the first histogram based on a parameter of the first encoding scheme and a parameter of a second encoding scheme of the plurality of error mitigation encoding schemes, and an estimation function for estimating a read voltage used for reading second data encoded by the second encoding scheme,
(b) the first histogram before correction, and the estimation function after correction which is obtained by correcting the estimation function based on the parameter of the first encoding scheme and the parameter of the second encoding scheme, or
(c) the first histogram after correction which is obtained by correcting a part of the first histogram based on the parameter of the first encoding scheme and the parameter of the second encoding scheme, and the estimation function after correction which is obtained by correcting a part of the estimation function based on the parameter of the first encoding scheme and the parameter of the second encoding scheme.

2. The memory system according to claim 1, wherein the estimation function is calculated by using a second histogram generated from reading the second data.

3. The memory system according to claim 2, wherein
the first histogram is generated based on the first data read using a reference read voltage, and
the second histogram is generated based on the second data read using a reference read voltage.

4. The memory system according to claim 2, wherein the memory controller is configured to estimate a read voltage used for reading the second data by using the second histogram which is uncorrected and the estimation function before correction.

5. The memory system according to claim 1, wherein the second encoding scheme is a scheme of writing data to the nonvolatile memory without performing error mitigation encoding.

6. The memory system according to claim 1, wherein the memory controller is configured to correct at least one of the first histogram and the estimation function based on a first occurrence probability of a plurality of write levels calculated based on the parameter of the first encoding scheme and a second occurrence probability of the plurality of write levels calculated based on the parameter of the second encoding scheme.

7. The memory system according to claim 6, wherein
the estimation function is a function that multiplies a matrix for estimating the read voltage by a vector having a frequency of each bin corresponding to each write level of the first histogram, as an element thereof, and
the memory controller corrects the estimation function by dividing a value of each element of the matrix corresponding to each write level of the first histogram by a ratio of the first occurrence probability to the second occurrence probability of each write level.

8. The memory system according to claim 6, wherein the memory controller corrects the first histogram by dividing the frequency of each bin corresponding to each write level of the first histogram by the ratio of the first occurrence probability to the second occurrence probability of each write level.

9. A method of determining a read voltage to be applied to read first data encoded by a first encoding scheme of a plurality of error mitigation encoding schemes from a nonvolatile memory of a memory system, said method comprising:
generating a first histogram indicating the number of memory cells for each of a plurality of threshold voltage ranges; and
estimating the read voltage used for reading the first data by using:
(a) the first histogram after correction which is obtained by correcting the first histogram based on a parameter of the first encoding scheme and a parameter of a second encoding scheme of the plurality of error mitigation encoding schemes, and an estimation function for estimating a read voltage used for reading second data encoded by the second encoding scheme,
(b) the first histogram before correction, and the estimation function after correction which is obtained by correcting the estimation function based on the parameter of the first encoding scheme and the parameter of the second encoding scheme, or
(c) the first histogram after correction which is obtained by correcting a part of the first histogram based on the parameter of the first encoding scheme and the parameter of the second encoding scheme, and the estimation function after correction which is obtained by correcting a part of the estimation function based on the parameter of the first encoding scheme and the parameter of the second encoding scheme.

10. The method according to claim 9, wherein the estimation function is calculated by using a second histogram generated from reading the second data.

11. The method according to claim 10, wherein
the first histogram is generated based on the first data read using a reference read voltage, and
the second histogram is generated based on the second data read using a reference read voltage.

12. The method according to claim 11, further comprising:
estimating a read voltage used for reading the second data by using the second histogram which is uncorrected and the estimation function before correction.

13. The method according to claim 9, wherein the second encoding scheme is a scheme of writing data to the nonvolatile memory without performing error mitigation encoding.

14. The method according to claim 9, wherein at least one of the first histogram and the estimation function is corrected based on a first occurrence probability of a plurality of write levels calculated based on the parameter of the first encoding scheme and a second occurrence probability of the plurality of write levels calculated based on the parameter of the second encoding scheme.

15. The method according to claim 14, wherein
the estimation function is a function that multiplies a matrix for estimating the read voltage by a vector having a frequency of each bin corresponding to each write level of the first histogram, as an element thereof, and
the estimation function is corrected by dividing a value of each element of the matrix corresponding to each write level of the first histogram by a ratio of the first occurrence probability to the second occurrence probability of each write level.

16. The method according to claim 14, wherein the first histogram is corrected by dividing the frequency of each bin corresponding to each write level of the first histogram by the ratio of the first occurrence probability to the second occurrence probability of each write level.

* * * * *